(12) United States Patent
Khazhinsky et al.

(10) Patent No.: US 7,593,202 B2
(45) Date of Patent: Sep. 22, 2009

(54) ELECTROSTATIC DISCHARGE (ESD) PROTECTION CIRCUIT FOR MULTIPLE POWER DOMAIN INTEGRATED CIRCUIT

(75) Inventors: Michael G. Khazhinsky, Austin, TX (US); Martin J. Bayer, Gilbert, AZ (US); James W. Miller, Austin, TX (US); Bryan D. Preble, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 453 days.

(21) Appl. No.: 11/264,557

(22) Filed: Nov. 1, 2005

(65) Prior Publication Data

US 2007/0097581 A1    May 3, 2007

(51) Int. Cl.
*H02H 9/00* (2006.01)
(52) U.S. Cl. ....................................... 361/56
(58) Field of Classification Search ............... 361/56
See application file for complete search history.

(56) References Cited

U.S. PATENT DOCUMENTS

| | | | |
|---|---|---|---|
| 4,385,337 A | 5/1983 | Asano et al. | |
| 5,034,845 A | 7/1991 | Murakami | |
| 5,237,395 A | 8/1993 | Lee | |
| 5,239,440 A | 8/1993 | Merrill | |
| 5,255,146 A | 10/1993 | Miller | |
| 5,287,241 A | 2/1994 | Puar | |
| 5,311,391 A | 5/1994 | Dungan et al. | |
| 5,361,185 A | 11/1994 | Yu | |
| 5,440,162 A | 8/1995 | Worley et al. | |
| 5,515,232 A | 5/1996 | Fukazawa et al. | |
| 5,559,659 A | 9/1996 | Strauss | |
| 5,610,790 A | 3/1997 | Staab et al. | |
| 5,654,862 A | 8/1997 | Worley et al. | |
| 5,946,177 A | 8/1999 | Miller et al. | |
| 5,991,135 A * | 11/1999 | Saleh | 361/56 |
| 6,078,068 A | 6/2000 | Tamura | |
| 6,385,021 B1 | 5/2002 | Takeda et al. | |
| 6,456,472 B1 | 9/2002 | Bériault | |
| 6,724,603 B2 | 4/2004 | Miller et al. | |
| 6,801,416 B2 | 10/2004 | Hatzilambrou et al. | |
| 7,272,802 B2 * | 9/2007 | McGrath et al. | 716/1 |
| 7,279,927 B2 * | 10/2007 | Falkowski et al. | 326/33 |

(Continued)

OTHER PUBLICATIONS

E.R. Worley, "Distributed Gate ESD Network Architecture for Inter-Power Domain Signals," EOS/ESD Symp. Proceedings, 2004.

(Continued)

*Primary Examiner*—Stephen W Jackson

(57) ABSTRACT

An integrated circuit (300/400) includes first and second power domains and a bank of input/output (I/O) cells (305/405) coupled to the first and second power domains. The bank of I/O cells (305/405) includes a first plurality of active clamps (374/445) for the first power domain and a second plurality of active clamps (384/425) for the second power domain wherein the first (374/445) and second (384/425) pluralities of active clamps overlap along the bank of I/O cells. According to one aspect each of the plurality of input/output cells (420, 440) has a bonding pad (421, 441) for receiving an output signal referenced to a respective first power domain, and at least one ESD protection element (425, 445) for a respective second power domain. According to another aspect, each of the plurality of input/output cells (420, 440) has a bonding pad (421, 441) for receiving a respective output signal and at least one ESD protection element for each of a first power domain and a second power domain.

20 Claims, 5 Drawing Sheets

OTHER PUBLICATIONS

W. Anderson, J. Montanaro and N Howorth, "Cross-Referenced ESD Protection for Power Supplies," EOS/ESD Symp. Proceedings, 1998.

W.D. Mack and R.G. Meyer, "New ESD Protection Schemes for BiCMOS Processes with Application to Cellular Radio Designs," ISCAS Proceedings 1992.

R. Merrill and E. Issaq, "ESD Design Methodology," Proc. EOS/ESD Symposium, pp. 233-237, 1993.

E. R. Worley, R. Gupta, B. Jones, R. Kjar, C. Nguyen, and M. Tennyson, "Sub-micron Chip ESD Protection Schemes which Avoid Avalanching Junctions," Proc. EOS/ESD Symposium, pp. 13-20, 1995.

G. Croft, "Transient Supply Clamp with a Variable RC Time Constant," EOS/ESD Symp. Proceedings, 1996, pp. 276-279.

J.C. Bernier, G.D. Croft, and W.R. Young, "A Process Independent ESD Design Methodology," ISCAS Proceedings, 1999.

P. Juliano and W. Anderson, "ESD Protection Design Challenges for a High Pin-Count Alpha Microprocessor in a 0.13um CMOS SOI Technology," EOS/ESD Symp. Proceedings, 2003.

M. Stockinger, J. W. Miller, M. G. Khazhinsky, C. A. Torres, J. C. Weldon, B. D. Preble, M. J. Bayer, M. Akers, and V. G. Kamat, "Boosted and Distributed Rail Clamp Networks for ESD protection in Advanced CMOS Technologies," in Proc. EOS/ESD Symp., pp. 17-26, 2003.

C. Torres, J. Miller, M. Stockinger, M. Akers, M. Khazhinsky and J. Weldon, "Modular, Portable and Easily Simulated ESD Protection Networks for Advanced CMOS Technologies," EOS/ESD Symp. Proceedings, 2001.

"Core Clamps for Low Voltage Technologies," Dabral et al., Intel Corporation, EOS/ESD Symposium Proceedings, 1994.

International Search Report and Written Opinion relating to PCT/US06/39647 dated Jun. 12, 2008.

* cited by examiner

ELECTROSTATIC DISCHARGE (ESD) PROTECTION CIRCUIT FOR MULTIPLE POWER DOMAIN INTEGRATED CIRCUIT

FIELD OF THE DISCLOSURE

The present application relates generally to integrated circuits, and more particularly to electrostatic discharge (ESD) protection circuits for integrated circuits.

BACKGROUND

Complementary metal-oxide-semiconductor (CMOS) integrated circuits (ICs) are susceptible to damage when exposed to an electrostatic discharge (ESD) event. An ESD event may occur, for example, when a user who has accumulated electrostatic charge picks up a CMOS IC. The accumulated charge may cause an instantaneous voltage of a few thousand volts to appear across terminals of the IC. This voltage is large enough to cause permanent damage to CMOS transistors, such as by rupturing the gates of the transistors. Thereafter, the CMOS IC cannot function properly.

In order to prevent the damage caused by an ESD event, CMOS IC designers include ESD protection circuits adjacent to input and/or output IC terminals. These circuits typically include diodes to discharge a large voltage appearing on a signal terminal into a power supply terminal. Designers also typically include active power supply voltage rail clamps that become active to quickly dissipate a voltage between the power and ground power supply voltage terminals built up during an ESD event.

Increasingly integrated circuits operate in multiple power domains. For example, it may be desirable to use multiple power domains to allow for different voltages for input/output buffers dedicated to each domain. However support for multiple power domains complicates the ESD protection task because now different discharge paths are possible. Furthermore when I/O buffers for one power domain are interspersed with I/O buffers for another power domain their ESD protection will require substantial layout area.

BRIEF DESCRIPTION OF THE DRAWINGS

The present disclosure may be better understood, and its numerous features and advantages made apparent to those skilled in the art by referencing the accompanying drawings, in which like reference numbers indicate similar or identical items.

DETAILED DESCRIPTION

Figure 1:
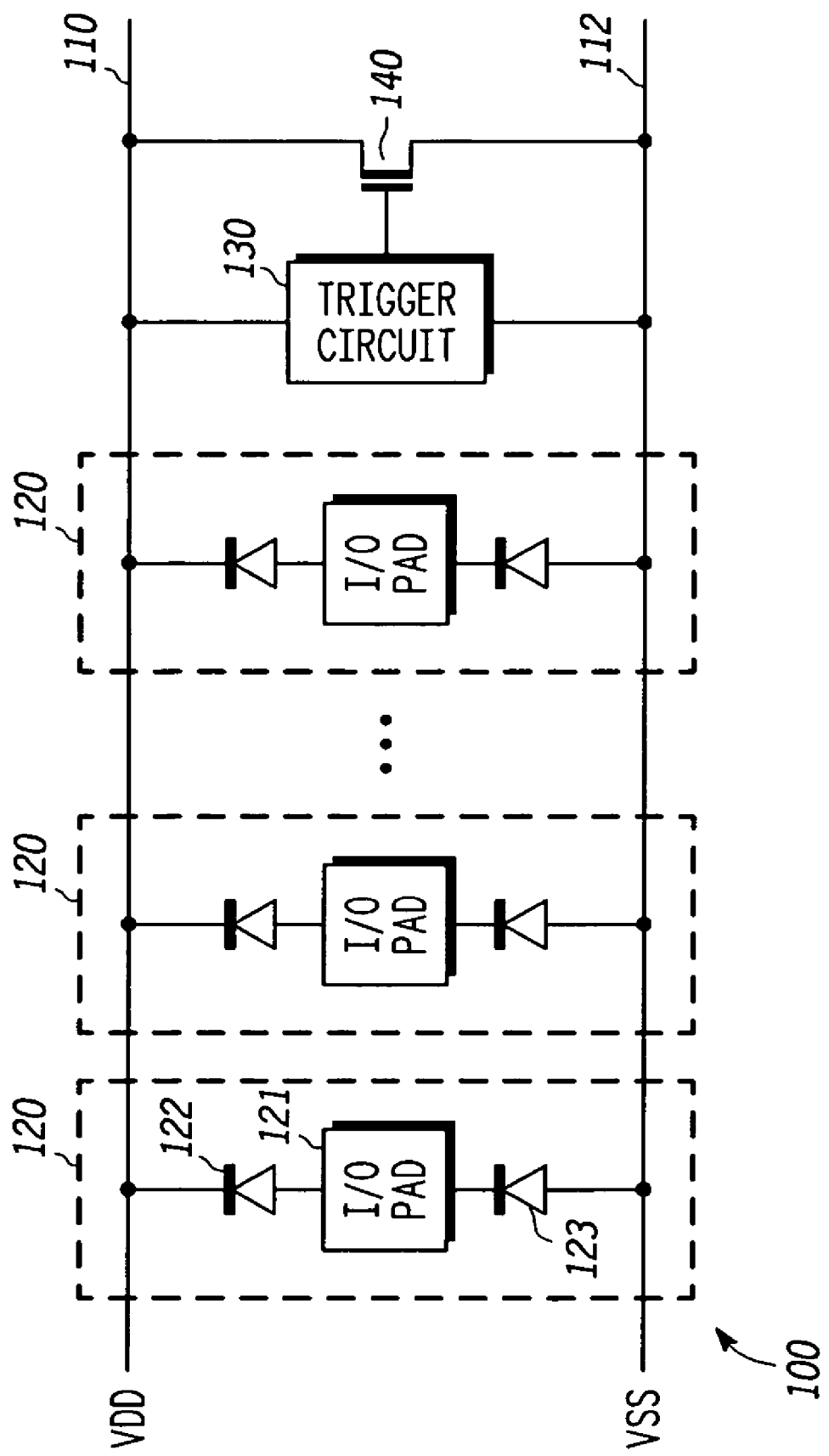
FIG. 1 illustrates in partial block diagram and partial schematic form a portion of an integrated circuit with electrostatic discharge (ESD) protection known in the prior art.

In one form an integrated circuit includes a first power domain, a second power domain, and a bank of input/output cells coupled to the first and second power domains. The bank of I/O cells includes a first plurality of active clamps for the first power domain and a second plurality of active clamps for the second power domain wherein the first and second pluralities of active clamps overlap along the bank of I/O cells.

According to one aspect of this integrated circuit, each of the first and second pluralities of active clamps operate in parallel to dissipate an ESD event occurring between positive power supply and ground rails of respective ones of the first and second power domains. The bank of I/O cells may further include a first plurality of I/O cells each conducting a respective I/O signal referenced to the first power domain, and a second plurality of I/O cells each conducting a respective I/O signal referenced to the second power domain.

In this case, each of the first plurality of I/O cells may include a first diode coupled between a respective bonding pad and a respective positive power supply rail of the first power domain, a second diode coupled between a respective ground rail of the first power domain and the respective bonding pad, and an active clamp coupled between the respective positive power supply rail and the respective ground rail of the first power domain. Furthermore, each of the second plurality of I/O cells may include a first diode coupled between a respective bonding pad and a respective positive power supply rail of the second power domain, a second diode coupled between a respective ground rail of the second power domain and the respective bonding pad, and an active clamp coupled between the respective positive power supply rail and the respective ground rail of the second power domain.

Alternatively, each of the first plurality of I/O cells may include a first diode coupled between a respective bonding pad and a respective positive power supply rail of the first power domain, a second diode coupled between a respective ground rail of the first power domain and the respective bonding pad, and an active clamp coupled between a respective positive power supply rail and a respective ground rail of the second power domain. Furthermore the second plurality of I/O cells may include a first diode coupled between a respective bonding pad and the respective positive power supply rail of the second power domain, a second diode coupled between the respective ground rail of the second power domain and the respective bonding pad, and an active clamp coupled between the respective positive power supply rail and the respective ground rail of the first power domain.

In another form an integrated circuit includes a plurality of input/output (I/O) calls. Each I/O cell has a bonding pad for conducting an I/O signal referenced to a respective first power domain and at least one ESD protection element for a respective second power domain. According to one aspect of this integrated circuit, each of the plurality of I/O cells further includes at least one ESD protection element for the respective first power domain.

According to another aspect of this integrated circuit, the plurality of I/O cells includes first and second I/O cells, in which the first I/O cell receives an output signal referenced to a first power domain and at least one ESD protection element for a second power domain, and the second I/O cell receives an output signal referenced to the second power domain and at least one ESD protection element for the first power domain.

According to yet another aspect of this integrated circuit, the at least one ESD protection element for the respective second power domain includes an active clamp, and the integrated circuit further includes trigger circuitry for activating the active clamps of the plurality of I/O cells in response to detecting ESD events. Moreover, the active clamp may include a metal-oxide-semiconductor (MOS) transistor having a first source/drain terminal coupled to a positive power supply voltage rail of the respective second power domain, a gate coupled to the trigger circuitry for receiving a respective trigger signal, and a second source/drain terminal coupled to a negative power supply voltage rail of the respective second power domain.

In another form, an integrated circuit includes a plurality of input/output (I/O) cells each having a bonding pad for conducting a respective I/O signal and at least one ESD protection element for each of a first power domain and a second power domain.

According to one aspect of this integrated circuit, for a first one of the plurality of I/O cells, the respective output signal is referenced to the first power domain, the at least one ESD protection device for the first power domain includes first and second diodes, and the at least one ESD protection device for the second power domain includes an active clamp. Furthermore, for a second one of the plurality of I/O cells, the respective output signal may be referenced to the second power domain, the at least one ESD protection device for the first power domain may include an active clamp, and the at least one ESD protection device for the second power domain may include first and second diodes. Still further, the active clamp for each of the first one of the plurality of I/O cells and the second one of the plurality of I/O cells may include a metal-oxide-semiconductor (MOS) transistor.

According to yet another aspect the integrated circuit further includes horizontally extending power supply buses for each of the first and second power domains, wherein each of the plurality of I/O cells is located adjacent to the plurality of horizontally extending power supply buses. In this case the integrated circuit may further include a power cell located adjacent to the horizontally extending positive and negative power supply buses, the power cell including trigger circuitry for activating the active clamp of each of the first and second I/O cells in response to ESD events. In this case the trigger circuitry may include first and second trigger circuits, in which the first trigger circuit has inputs coupled between positive and negative power supply voltage rails of the first power domain, and an output for providing a first trigger signal to activate the active clamp of the second power domain in response to sensing an ESD event in the first power domain, and the second trigger circuit has inputs coupled between positive and negative power supply voltage rails of the second power domain, and an output for providing a second trigger signal to activate the active clamp of the second power domain in response to sensing an ESD event in the second power domain. In this case the integrated circuit may further include first and second diodes, the first diode having a positive terminal coupled to a bonding pad of the first I/O cell, and a negative terminal coupled to a first boost rail, and the second diode having a positive terminal coupled to a bonding pad of the second I/O cell, and a negative terminal coupled to a second boost rail, wherein the first trigger circuit further has an input coupled to the first boost rail and provides the first trigger signal using a voltage on the first boost rail, and the second trigger circuit further has an input coupled to the boost rail and provides the second trigger signal further in response to sensing an ESD event on the second boost rail.

Now referring to the drawings, FIG. 1 illustrates in partial block diagram and partial schematic form a portion of an integrated circuit 100 with electrostatic discharge (ESD) protection known in the prior art. Integrated circuit 100 includes multiple input/output (I/O) cells 120. Note that the term "I/O cell" encompasses an input-only cell, an output-only cell, or an input and output cell. Likewise note that the term "I/O pad" encompasses a pad that conveys only an input signal, only an output signal, or both an input signal and an output signal. In physical layout, I/O cells 120 are placed adjacent to each other as shown in FIG. 1 to form a horizontal bank of I/O cells, occupying a specific area in the integrated circuit (IC) periphery. Running alongside each of the I/O cells in the bank are two power supply voltage conductors or "rails." Each I/O cell in the bank is connected between the more positive power rail 110 labeled "VDD" and the more negative power rail 112 labeled "VSS." Note that the I/O bank may contain any number of I/O cells 120 as indicated by the three dots shown in FIG. 1. In addition to the I/O cells, a trigger circuit 130 and an N-channel metal-oxide-semiconductor (MOS) transistor 140 are placed at one end of the I/O bank. VDD is a more positive power supply voltage rail having a nominal voltage of about 3.0 volts, but this voltage may vary in other embodiments. VSS is a ground power supply voltage terminal having nominal voltage of about 0 volts. Note that as used herein, a "metal-oxide-semiconductor" transistor refers generically to an insulated gate transistor suitable for manufacturing in complementary MOS (CMOS) process or the like, regardless of whether metal, silicide, polysilicon, or some other gate material is used, and regardless of whether silicon dioxide, silicon nitride, or some other type of insulator is used for the gate insulation.

Each I/O cell 120 has identical structure and includes a bonding pad labeled "I/O PAD" 121 and diodes 122 and 123. I/O pad 121 is an interconnection point between circuitry internal to the integrated circuit and external circuitry, neither of which are shown in FIG. 1. Diode 122 has a positive terminal (anode) connected to I/O pad 121, and a negative terminal (cathode) connected to power supply rail 110. Diode 123 has a positive terminal connected to power supply rail 112, and a negative terminal connected to I/O pad 121.

Trigger circuit 130 has power supply terminals connected between power supply rail 110 and power supply rail 112, and an output terminal. Transistor 140 has a first source/drain terminal connected to power supply rail 110, a gate connected to the output terminal of trigger circuit 130, and a second source/drain terminal connected to power supply rail 112.

In operation, the ESD protection circuitry shown in FIG. 1 provides two mechanisms of protection. First, diodes 122 and 123 provide protection for an ESD event that may occur when a large voltage is developed between either of power supply rail 110 or power supply rail 112, and I/O pad 121. For example, in response to a large positive electrostatic voltage difference between I/O pad 121 and power supply rail 110, diode 122 becomes conductive to dissipate the large voltage difference. In response to a large negative electrostatic voltage difference between I/O pad 121 and power supply rail 112, diode 123 becomes conductive to dissipate the large voltage difference.

Second, trigger circuit 130 detects a large ESD voltage transient between its power supply terminals and outputs a trigger signal at its output terminal in response. Transistor 140 becomes conductive, again dissipating the large voltage difference. Transistor 140 may be referred to as a shunting device, a shunting transistor, or an active clamp. Note that transistor 140 operates as a gated-on MOSFET during the ESD event. Trigger circuit 130 maintains transistor 140 in the conductive state for the duration of the ESD event.

More specifically, consider a positive ESD event on an I/O pad 121 referenced to grounded VSS. The voltage of I/O pad 121 rises rapidly as the positive ESD event is encountered. Diode 122 becomes forward biased, causing the voltage on rail 110 to increase as well. Trigger circuit 130 senses the ESD event, and activates the trigger signal at its output to make shunting device 140 conductive. By making shunting device 140 conductive, ESD protection circuit 100 allows the transient ESD current to flow harmlessly between rails 110 and 112, protecting fragile elements in I/O cells 120.

During this exemplary ESD event, the voltage on I/O pad 121 rises to a peak level set by the sum of the voltage drops as the peak current of the applied ESD event flows through the intended dissipation path. If an equivalent ESD event is applied in turn to each of the I/O pads in FIG. 1, it can be seen that the I/O pad most distant from shunting device 140 will reach the highest peak voltage, due to the larger amount of series resistance on rail 110 between the stressed I/O pad and shunting device 140.

Figure 2:
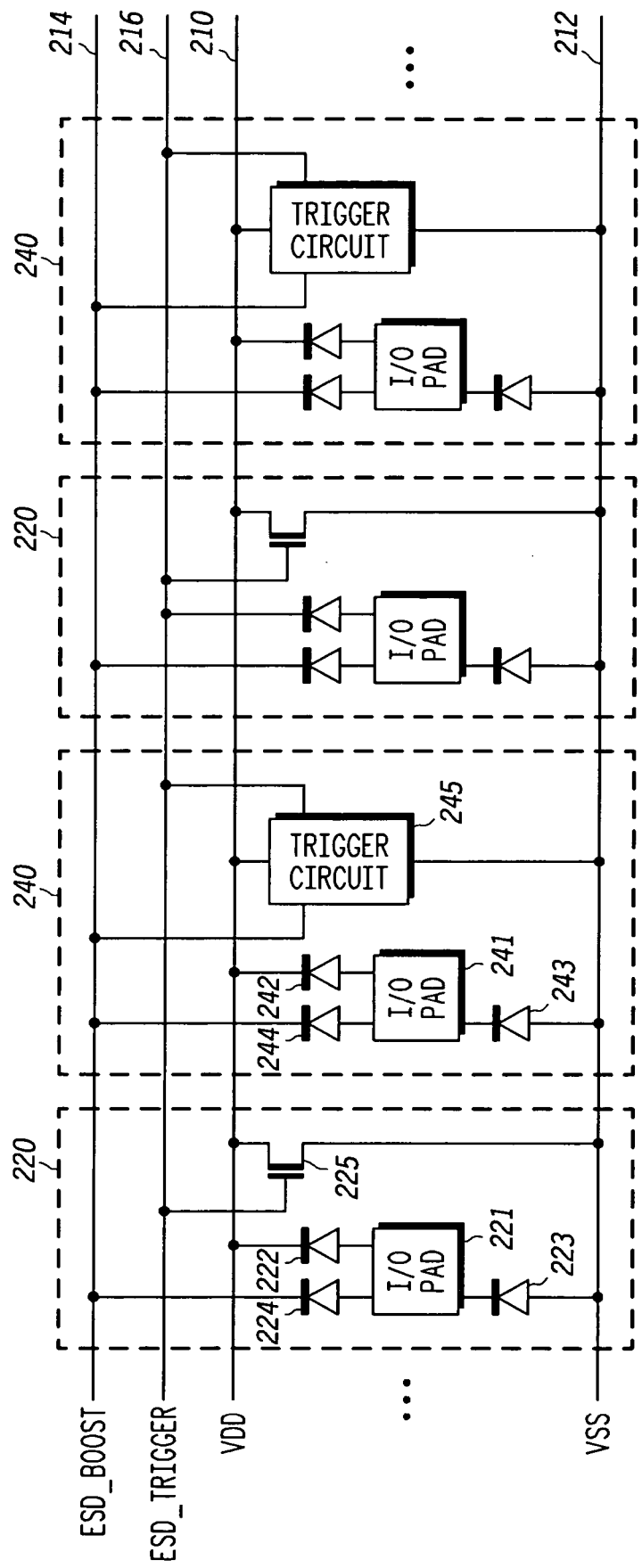
FIG. 2 illustrates in partial block diagram and partial schematic form a portion of another integrated circuit with ESD protection known in the prior art.

Thus ESD protection circuit 100 may not be sufficient to protect against ESD events between the buses that occur far away from shunting device 140. An improvement is shown in FIG. 2, which illustrates in partial block diagram and partial schematic form a portion of another integrated circuit 200 with ESD protection known in the prior art. Integrated circuit 200 includes VDD power supply rail 210 and a VSS power supply rail 212, but has two different types of I/O cells including an I/O cell 220 and an I/O cell 240 connected between the power supply rails. While only two instances of representative I/O cells 220 and 240 are shown in FIG. 2, additional instances of both I/O cells may be placed as indicated by the three dots on the right and left side of the cells shown. In addition, integrated circuit 200 has two additional rails 214 and 216 that respectively conduct signals labeled "ESD_BOOST" and "ESD_TRIGGER."

I/O cell 220 includes a bonding pad labeled "I/O PAD" 221, diodes 222, 223, and 224, and an N-channel MOS transistor 225. I/O pad 221 is an interconnection point between circuitry internal to the integrated circuit and external circuitry, neither of which are shown in FIG. 2. Diode 222 has a positive terminal connected to I/O pad 221, and a negative terminal connected to power supply rail 210. Diode 223 has a positive terminal connected to power supply rail 212, and a negative terminal connected to I/O pad 221. Diode 224 has a positive terminal connected to I/O pad 221, and a negative terminal connected to rail 214. Transistor 225 has a first source/drain terminal connected to power supply rail 210, a gate connected to rail 216, and a second source/drain terminal connected to power supply rail 212.

I/O cell 240 includes a bonding pad labeled "I/O PAD" 241, diodes 242, 243, and 244, and a trigger circuit 245. I/O pad 241 is an interconnection point between circuitry internal to the integrated circuit and external circuitry, neither of which are shown in FIG. 2. Diode 242 has a positive terminal connected to I/O pad 241, and a negative terminal connected to power supply rail 210. Diode 243 has a positive terminal connected to power supply rail 212, and a negative terminal connected to I/O pad 241. Diode 244 has a positive terminal connected to I/O pad 241, and a negative terminal connected to rail 214. Trigger circuit 245 has power supply terminals connected between rails 210 and 212, a boost input terminal connected to rail 214, and an output terminal connected to rail 216.

In operation, integrated circuit 200 has two additional protection features beyond those of integrated circuit 100 of FIG. 1. First, integrated circuit 200 distributes shunting transistors (like transistor 225 in I/O cell 220) and trigger circuits (like trigger circuit 245 in I/O cell 240) among the I/O cells to be protected. Thus ESD events are detected, and the power supply rails are shorted, closer to the I/O pad on which the event occurs. For example consider a positive ESD event applied to a single I/O pad 221, relative to VSS bus 212 being grounded. The intended primary ESD current path for this ESD event includes a single diode 222 to VDD bus 210, and then via multiple N-channel MOS transistors 225 in each I/O cell 220 to VSS bus 212. Distributing the shunting transistors within many of the I/O cells to be protected and then allowing these shunting transistors to operate in parallel during an ESD event greatly improves ESD circuit performance. An intent of this distributed network of shunting transistors is to minimize the negative impact of VDD and VSS power rail resistance. This is a significant improvement over the circuit of FIG. 1, which had fewer shunting devices placed less frequently among the I/O cells. In response to a detected ESD event, the trigger circuits in I/O cells 240 drive the gates of the shunting devices 225 in I/O cells 220, via the ESD_TRIGGER bus 216. The ESD protection circuit of FIG. 2 has an advantage over the circuit of FIG. 1 in that all of the ESD protection elements, including active clamps and trigger circuits, are contained within the I/O cells themselves.

Second, integrated circuit 200 includes ESD_BOOST rail 214 to improve the operation of the shunting transistors. In ESD protection circuits without the additional boost feature, the control electrodes of the multiple shunting devices are typically biased at a voltage equal to the voltage applied to their respective positive current electrodes. However, if the shunting device is placed some distance along the VDD rail away from the stressed I/O pad, large IR drops may occur along the VDD rail. In contrast, in integrated circuit 200, each I/O cell has an additional diode, like diode 224 in I/O cells 220 or diode 244 in I/O cells 240, to charge the voltage on rail 214 during a positive ESD event. Trigger circuits like trigger circuit 245 in I/O cell 240 use this ESD_BOOST voltage to drive the trigger signal on rail 216 to a higher voltage. Since trigger circuits 245 draw very little current when enabled during an ESD event, there is a significantly smaller IR voltage drop along ESD_BOOST rail 214 between any stressed pad and the trigger circuits compared to the drop along VDD rail 210. Therefore the trigger circuits are able to drive the control electrodes of the multiple shunting devices to a voltage level generally greater than the voltage level on VDD rail 210 local to each shunting device. This "overdrive" of the shunting devices greatly improves their conductivity, thereby improving the performance of the ESD protection circuit.

The ESD protection circuits shown thus far in FIGS. 1 and 2 protect an integrated circuit within a group or a bank of I/O cells associated with a single VDD and VSS power supply rail pair, or in other words, with a bank of I/O cells operating within a single power domain. In the prior art example of FIG. 2, multiple shunting devices 225, placed in I/O cells 220, operate in parallel to short VDD rail 210 and VSS rail 212 during an ESD event. However integrated circuits are now being manufactured having multiple power domains. ESD protection circuits like those shown in FIG. 2 can provide protection for these domains, as long as the I/O cells are partitioned into banks uniquely associated with a single power supply domain. Within each bank, only a single VDD and VSS power supply rail pair is present for powering I/O circuitry in the local I/O cells. The VDD power supply rail, and in some cases the VSS rail, must be broken, or noncontinuous at transitions between I/O banks associated with different power domains.

Figure 3:
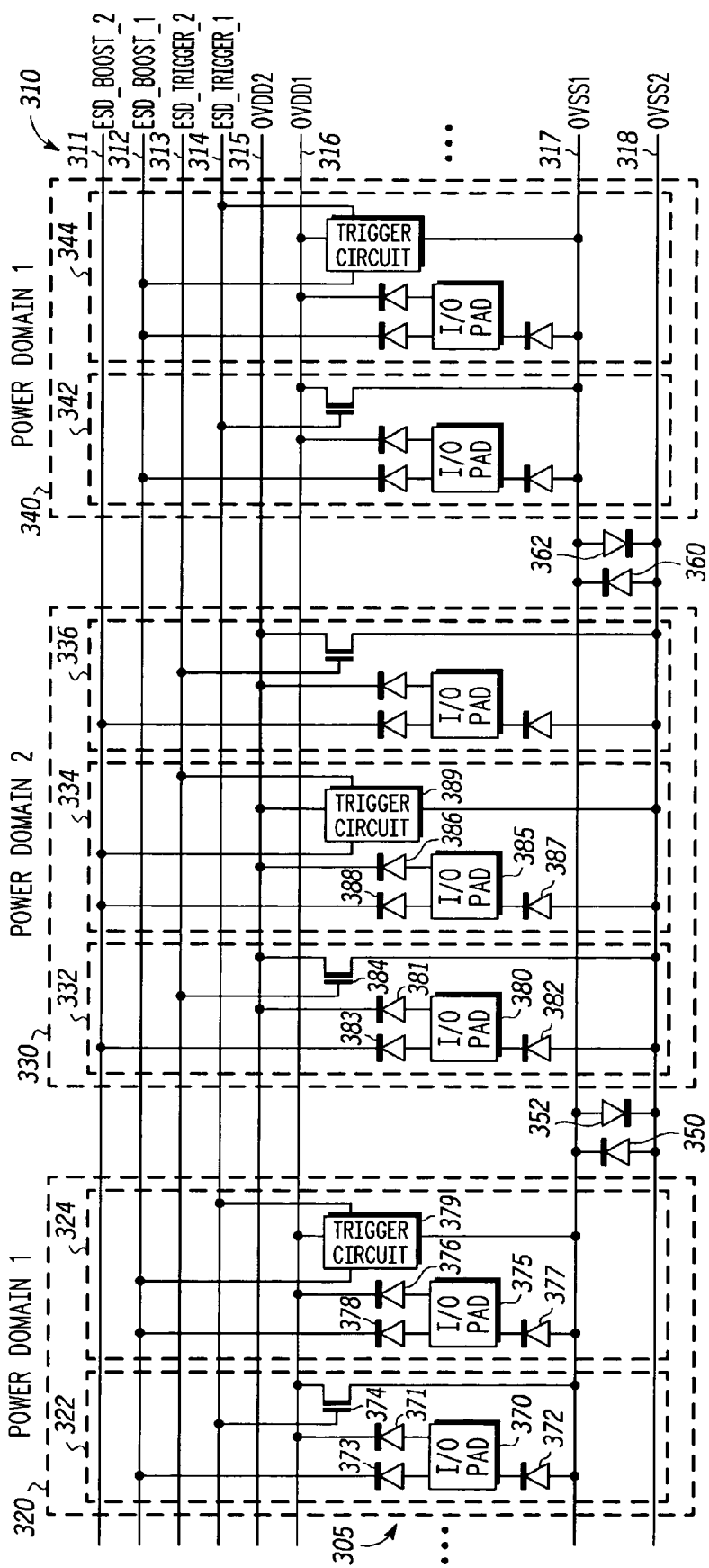
FIG. 3 illustrates in partial block diagram and partial schematic form a multiple power domain integrated circuit having ESD protection according to one embodiment of the present invention.

Of particular concern are IC designs where I/O cells from two or more separate power domains overlap and are interspersed within a single I/O bank. FIG. 3 illustrates in partial block diagram and partial schematic form a multiple power domain integrated circuit 300 having ESD protection according to one embodiment of the present invention. In integrated circuit 300, a first power domain, labeled "POWER DOMAIN 1" is established between a more-positive power supply voltage rail 316 labeled "OVDD1" and a more-negative power supply voltage rail 317 labeled "OVSS1." Likewise a second power domain, labeled "POWER DOMAIN 2" is established between a more-positive power supply voltage rail 315 labeled "OVDD2" and a more-negative power supply voltage rail 318 labeled "OVSS2." Note that the first and second power domains could alternately be established between separate positive power supply rails and a common or shared ground rail. Since in the disclosed embodiment integrated circuit 300 uses separate ground rails, it includes pairs of diodes 350/352 and 360/362 bidirectionally connected between the separate ground rails to prevent one ground rail from rising substantially above the other due to an ESD event.

In the physical layout of integrated circuit 300 a set of substantially parallel rails 310 runs alongside a bank of I/O cells 305, wherein each I/O cell may be associated with either power domain 1 or power domain 2. Set of rails 300 includes a rail 311 conducting a boost signal for power domain 2 labeled "ESD_BOOST_2", a rail 312 conducting a boost signal for power domain 1 labeled "ESD_BOOST_1", a rail 313 conducting a trigger signal for power domain 2 labeled "ESD_TRIGGER_2", a rail 314 conducting a trigger signal for power domain 1 labeled "ESD_TRIGGER_1," and rails 315-318 described above. I/O cells associated with each of the two power domains are interspersed along and are adjacent to the set of rails 300. These I/O cells together form an I/O bank 305. As shown in the embodiment of FIG. 3, bank 305 includes I/O cells each having an I/O pad and ESD elements. Not shown in the I/O cells of FIG. 3, but assumed present, is the I/O circuitry desired to be protected from ESD damage, such as for example P-channel MOSFET (PMOSFET) and N-channel MOSFET (NMOSFET) output drivers, input buffers, and other circuit components typically included for normal I/O operation. In each I/O cell of bank 305, these output drivers, input buffers, etc., are powered by, or associated with either power domain 1 or power domain 2. In one embodiment, bank 305 is part of a larger bank of I/O cells around the IC periphery region as indicated by the dots placed to the left and right of the elements shown in FIG. 3.

Integrated circuit 300 generally includes circuitry that provides protection for both the first power domain and the second power domain using diodes, shunting devices and trigger circuits. It uses separate power (OVDD, OVSS) and ESD (ESD_BOOST, ESD_TRIGGER) rails for each power domain, and within each power domain intersperses I/O cells having trigger circuits with those having shunting transistors to improve ESD circuit performance. Integrated circuit 300 includes a sub-bank 320 associated with power domain 1 and including I/O cells 322 and 324, a sub-bank 330 associated with power domain 2 and including I/O cells 332, 334, and 336, and a sub-bank 340 associated with power domain 1 and including I/O cells 342 and 344. In sub-bank 320, I/O cell 322 includes an I/O pad 370, diodes 371-373, and an N-channel MOS transistor 374. I/O pad 370 is an interconnection point between circuitry internal to the integrated circuit and external circuitry, not shown in FIG. 3. Diode 371 has a positive terminal connected to I/O pad 370, and a negative terminal connected to power supply rail 316. Diode 372 has a positive terminal connected to power supply rail 317, and a negative terminal connected to I/O pad 370. Diode 373 has a positive terminal connected to I/O pad 370, and a negative terminal connected to rail 312. Transistor 374 has a first source/drain terminal connected to power supply rail 316, a gate connected to rail 314, and a second source/drain terminal connected to power supply rail 317. I/O cell 324 includes an I/O pad 375, diodes 376-378, and a trigger circuit 379. Diode 376 has a positive terminal connected to I/O pad 375, and a negative terminal connected to power supply rail 316. Diode 377 has a positive terminal connected to power supply rail 317, and a negative terminal connected to I/O pad 375. Diode 378 has a positive terminal connected to I/O pad 375, and a negative terminal connected to rail 312. Trigger circuit 379 has power supply input terminals connected to rails 316 and 317, a boost input terminal connected to rail 312, and a trigger output terminal connected to rail 314. I/O cells 322 and 324 are each associated with power domain 1 and, in the physical layout of integrated circuit 300, are placed adjacent to each other and to rails 310 in I/O bank 305.

In sub-bank 330, I/O cell 332 includes an I/O pad 380, diodes 381-383, and an N-channel MOS transistor 384. Diode 381 has a positive terminal connected to I/O pad 380, and a negative terminal connected to power supply rail 315. Diode 382 has a positive terminal connected to power supply rail 318, and a negative terminal connected to I/O pad 380. Diode 383 has a positive terminal connected to I/O pad 380, and a negative terminal connected to rail 311. Transistor 384 has a first source/drain terminal connected to power supply rail 315, a gate connected to rail 313, and a second source/drain terminal connected to power supply rail 318. I/O cell 334 includes an I/O pad 385, diodes 386-388, and a trigger circuit 389. Diode 386 has a positive terminal connected to I/O pad 385, and a negative terminal connected to power supply rail 315. Diode 387 has a positive terminal connected to power supply rail 318, and a negative terminal connected to I/O pad 385. Diode 388 has a positive terminal connected to I/O pad 385, and a negative terminal connected to rail 311. Trigger circuit 389 has power supply input terminals connected to rails 315 and 318, a boost input terminal connected to rail 311, and a trigger output terminal connected to rail 313. I/O cell 336 is structurally identical to cell 332. I/O cells 332, 334, and 336 are each associated with power domain 2 and, in the physical layout of integrated circuit 300, are placed adjacent to each other in I/O bank 305.

In sub-bank 340, I/O cell 342 is identical to I/O cell 322 and I/O cell 344 is identical to I/O cell 324.

The substantially parallel power supply rails 310 extend alongside all of the I/O cells in I/O bank 305. By routing all power supply lines throughout I/O bank 305, I/O cells associated with either power domain can be placed freely along rails 310 and interspersed with each other. I/O cells associated with either the first power domain or the second power domain can be placed at arbitrary positions in I/O bank 305. I/O cells 322, 324, 332, 334, 336, 342, and 344 may be arranged in any sequence and with varying numbers along buses 310. While in the embodiment of FIG. 3, each I/O cell 322 or 332 (with shunting device 374 or 384) is shown adjacent to corresponding I/O cell 324 or 334 (with trigger circuit 379 or 389), this placement is not required. In a preferred embodiment, I/O cells like cells 322 or 332 (with shunting devices 374 or 384) would be placed with about five times greater frequency than I/O cells like cells 324 or 334 (with trigger circuits 379 or 389). This placement is due to the fact that it is the shunting devices that actually short the positive and negative power rails during an ESD event. In some embodiments, the shunting devices and trigger circuits may be made directly interchangeable in the physical layout of the I/O cell. This interchangeability increases the modularity of the layout cells. In some embodiments of the present invention, ESD_BOOST_1 bus 312 may be merged with OVDD1 bus 316, and ESD_BOOST_2 bus 311 may be merged with OVDD2 bus 315, providing a non-boosted version of the ESD circuit, with no overdrive of the shunting devices. In yet another embodiment, shunting devices and trigger circuits may be placed together in the I/O cells. In this embodiment, all the I/O cells associated with power domain 1 would contain all the elements shown in I/O cell 322 in FIG. 3, with the addition of the trigger circuit from I/O cell 324. Likewise, all the I/O cells associated with power domain 2 would contain all the elements shown in I/O cell 332, with the addition of the trigger circuit from I/O cell 334. In this embodiment, the ESD_TRIGGER_1 and ESD_TRIGGER_2 rails may optionally be removed. Also the trigger circuits could be distributed differently within the I/O bank, such as being within the I/O cells, or existing outside such cells. Note that in integrated circuit 300, separate ground rails 317 and 318 are used. Pairs of diodes 350/352 and 360/362 are bidirectionally connected between the separate ground rails to couple ESD currents between power domains. In other embodiments ground rails 317 and 318 may be merged, and the bidirectional diode pairs removed.

I/O bank 305 is formed from an interspersed mixture of I/O cells associated with two different power domains. In bank 305, ESD protection elements for each of the two power domains are interspersed, but they are contained in sub-banks that conduct I/O signals referenced to corresponding power domains. Buses 310 are routed throughout the bank. Active clamps, which operate in parallel within a single power domain, are placed in a plurality of I/O cells 322 (power domain 1) or I/O cells 332 and 336 (power domain 2), providing dual overlapping distributed active clamp networks within I/O bank 305. The active clamp networks may be described as overlapping ("interspersed") if a single shunting device 374 (in I/O cell 322) which is part of the distributed active clamp network for power domain 1, overlaps any portion of the distributed active clamp network for power domain 2, within I/O bank 305. While only two power domains are included in the bank shown in FIG. 3, other embodiments may include an interspersed mixture of I/O cells associated with a larger number of power domains.

Figure 4:
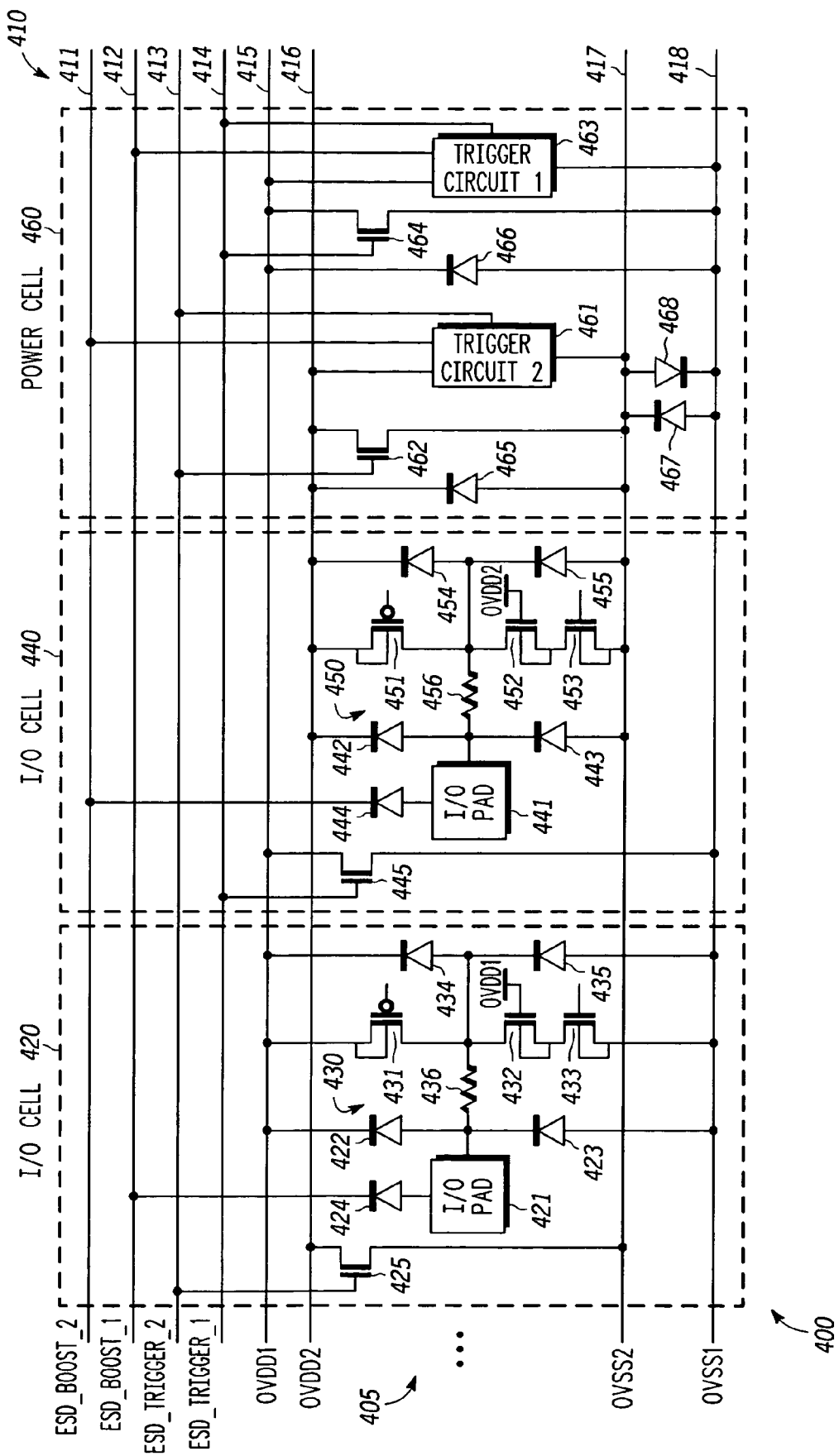
FIG. 4 illustrates in partial block diagram and partial schematic form a multiple power domain integrated circuit having ESD protection according to another embodiment of the present invention.

Note that all of the ESD elements in I/O cells 322 and 324 in FIG. 3 are associated with power supply domain 1. Likewise, all of the ESD elements in I/O cells 332, 334, and 336 are associated with power supply domain 2. Depending on the physical architecture and floor plan of the I/O cells and power rails 310, it may be more efficient in some cases to mix ESD elements from each power domain in a single I/O cell. An example in which this mixing is done is shown in FIG. 4. FIG. 4 illustrates in partial block diagram and partial schematic form a multiple power domain integrated circuit 400 having ESD protection according to another embodiment of the present invention. In integrated circuit 400, a first power domain is established between a more-positive power supply voltage rail 415 labeled "OVDD1" and a more-negative power supply voltage rail 418 labeled "OVSS1." Likewise a second power domain is established between a more-positive power supply voltage rail 416 labeled "OVDD2" and a more-negative power supply voltage rail 417 labeled "OVSS2."

A set of horizontally extending power supply rails 410 cross a bank of I/O cells 405 for the multiple power domains, including a rail 411 conducting a boost signal for the second power domain labeled "ESD_BOOST_2", a rail 412 conducting a boost signal for the first power domain labeled "ESD_BOOST_1", a rail 413 conducting a trigger signal for the second power domain labeled "ESD_TRIGGER_2", a rail 414 conducting a trigger signal for the first power domain labeled "ESD_TRIGGER_1", and rails 415-418 described above.

Integrated circuit 400 generally includes I/O cells providing output signals in the first power domain such as a representative I/O cell 420, I/O cells providing output signals in the second power domain such as a representative I/O cell 440, and at least one power cell providing trigger signals for both power domains such as a representative power cell 460.

I/O cell 420 includes an I/O pad 421, diodes 422-424, an N-channel MOS transistor 425, and a portion of an output buffer 430. I/O pad 421 is an interconnection point between circuitry internal to the integrated circuit and external circuitry, not shown in FIG. 4. Diode 422 has a positive terminal connected to I/O pad 421, and a negative terminal connected to power supply rail 415. Diode 423 has a positive terminal connected to power supply rail 418, and a negative terminal connected to I/O pad 421. Diode 424 has a positive terminal connected to I/O pad 421, and a negative terminal connected to rail 412. Transistor 425 has a first source/drain terminal connected to power supply rail 416, a gate connected to rail 413, and a second source/drain terminal connected to power supply rail 417. Output buffer 430 includes a P-channel MOS transistor 431, N-channel MOS transistors 432 and 433, diodes 434 and 435, and resistor 436. Transistor 431 has a source connected to rail 415, a gate for receiving a first predrive signal, and a drain. Transistor 432 has a drain connected to the drain of transistor 431, a gate connected to OVDD2, and a source. Transistor 433 has a drain connected to the source of transistor 432, a gate for receiving a second predrive signal, and a source connected to rail 418. Diode 434 has a positive terminal connected to the drains of transistors 431 and 432, and a negative terminal connected to rail 415. Diode 435 has a positive terminal connected to rail 418, and a negative terminal connected to the drains of transistors 431 and 432. Resistor 436 has a first terminal connected to the drains of transistors 431 and 432, and a second terminal connected to I/O pad 421.

I/O cell 440 includes an I/O pad 441, diodes 442-444, an N-channel MOS transistor 445, and a portion of an output buffer 450. I/O pad 441 is an interconnection point between circuitry internal to the integrated circuit and external circuitry, not shown in FIG. 4. Diode 442 has a positive terminal connected to I/O pad 441, and a negative terminal connected to power supply rail 416. Diode 443 has a positive terminal connected to power supply rail 417, and a negative terminal connected to I/O pad 441. Diode 444 has a positive terminal connected to I/O pad 441, and a negative terminal connected to rail 411. Transistor 445 has a first source/drain terminal connected to power supply rail 415, a gate connected to rail 414, and a second source/drain terminal connected to power supply rail 418. Output buffer 450 includes a P-channel MOS transistor 451, N-channel MOS transistors 452 and 453, diodes 454 and 455, and a resistor 456. Transistor 451 has a source connected to rail 416, a gate for receiving a third predrive signal, and a drain. Transistor 452 has a drain connected to the drain of transistor 451, a gate connected to OVDD1, and a source. Transistor 453 has a drain connected to the source of transistor 452, a gate for receiving a fourth predrive signal, and a source connected to rail 417. Diode 454 has a positive terminal connected to the drains of transistors 451 and 452, and a negative terminal connected to rail 416.

Diode 455 has a positive terminal connected to rail 417, and a negative terminal connected to the drains of transistors 451 and 452. Resistor 456 has a first terminal connected to the drains of transistors 451 and 452, and a second terminal connected to I/O pad 441.

Power cell 460 includes a circuit 461 labeled "TRIGGER CIRCUIT 2," an N-channel MOS transistor 462, a circuit 463 labeled "TRIGGER CIRCUIT 1," an N-channel MOS transistor 464, and diodes 465-468. Trigger circuit 461 has power supply input terminals connected to rails 416 and 417, a boost input terminal connected to rail 411, and a trigger output terminal connected to rail 413. Transistor 462 has a first source/drain terminal connected to rail 416, a gate connected to rail 413, and a second source/drain terminal connected to rail 417. Trigger circuit 463 has power supply input terminals connected to rails 415 and 418, a boost input terminal connected to rail 412, and a trigger output terminal connected to rail 414. Transistor 464 has a first source/drain terminal connected to rail 415, a gate connected to rail 414, and a second source/drain terminal connected to rail 418. Diode 465 has a positive terminal connected to rail 417, and a negative terminal connected to rail 416. Diode 466 has a positive terminal connected to rail 418, and a negative terminal connected to rail 415. Diode 467 has a positive terminal connected to rail 418, and a negative terminal connected to rail 417. Diode 468 has a positive terminal connected to rail 417, and a negative terminal connected to rail 418.

In operation, ESD protection circuit 400 has many of the same protection mechanisms as ESD protection circuit 300 of FIG. 3, but may allow for more compact and modular layout. In bank 405, ESD protection elements for each of the two power domains are interspersed, but unlike bank 305 of FIG. 3, ESD protection elements for the first power domain are distributed between cells that conduct I/O signals referenced to the first power domain and cells that conduct signals referenced to the second power domain. Likewise, ESD protection elements for the second power domain are distributed between cells that conduct I/O signals referenced to the first power domain and cells that conduct signals referenced to the second power domain. More particularly, I/O cell 420 includes a bonding pad providing an output signal referenced to the first power domain, but an ESD protection element in the form of active clamp transistor 425 that protects the second power domain. Conversely, I/O cell 440 includes a bonding pad providing an output signal referenced to the second power domain, but an ESD protection element in the form of active clamp transistor 425 that protects the first power domain. By forming I/O cells having I/O pads providing output signals from one power domain with ESD protection circuitry protecting another power domain, the cell can be made compactly by using available power bus routing, as will be described more fully with respect to FIG. 5 below.

In addition, each I/O cell includes one or more protection elements for each of the two power domains. Thus, I/O cell 420 includes diodes 422 and 423 to protect the first power domain, and active clamp 425 for protecting the second power domain. Likewise, I/O cell 440 includes diodes 442 and 443 to protect the second power domain, and active clamp 445 for protecting the first power domain. Providing protection devices for both power domains may reduce the IR drop along the longest discharge path when I/O cells for two power domains are interspersed. It should be apparent that this technique can be extended to an arbitrary number of power domains.

Figure 5:
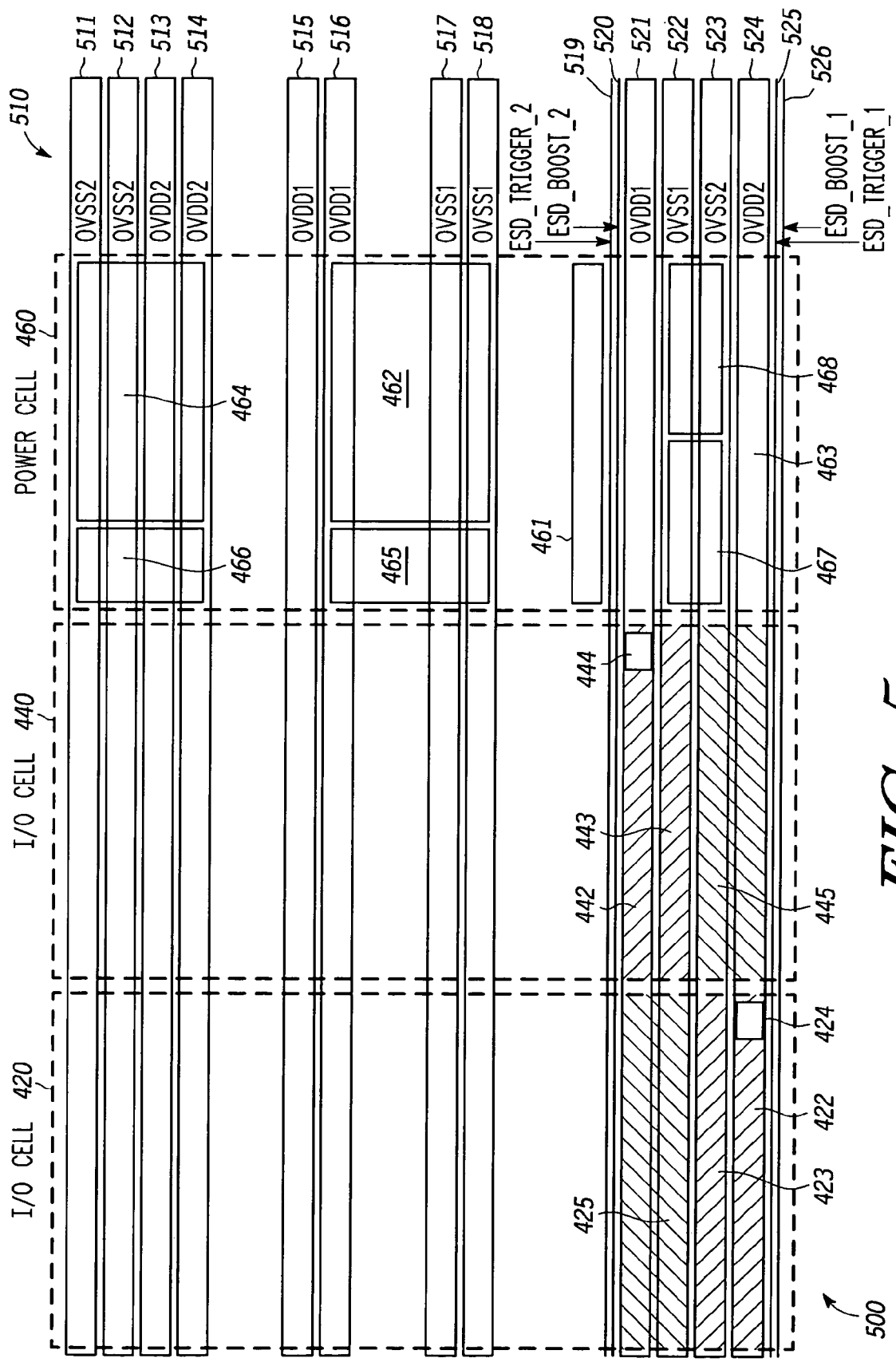
FIG. 5 illustrates a plan view of a portion of the integrated circuit of FIG. 4.

FIG. 5 illustrates a plan view 500 of a portion of integrated circuit 400 of FIG. 4. In FIG. 5 layout areas are assigned the same reference numbers as corresponding circuit elements of FIG. 4. Thus FIG. 5 illustrates a set of horizontally extending rails 510 corresponding generally to power supply rails 410 of FIG. 4. Rails 510 include rails 511 and 512 conducting power supply voltage OVSS2, rails 513 and 514 conducting power supply voltage OVDD2, rails 515 and 516 conducting power supply voltage OVDD1, rails 517 and 518 conducting power supply voltage OVSS1, a rail 519 conducting signal ESD_TRIGGER_2, a rail 520 for signal ESD_BOOST_2, a rail 521 conducting power supply voltage OVDD1, a rail 522 conducting OVSS1, rail 523 conducting OVSS2, a rail 524 conducting OVDD2, a rail 525 conducting ESD_TRIGGER_1, and a rail 526 conducting ESD_TRIGGER_1.

Set of horizontally extending rails 510 are metal lines formed in an upper layer of the integrated circuit. Adjacent to rails 510 in lower layers of integrated circuit 400 are three I/O cells including I/O cell 420, I/O cell 440, and power cell 460 each shown in dashed-line form.

I/O cell 420 includes a bonding pad, not shown in FIG. 5, for forming an interconnection point for the corresponding I/O signal and four identified areas relevant to understanding the layout. Within I/O cell 420 and underneath power supply conductors 521 and 522 is an area 425 shown in crosshatch and corresponding to clamping transistor 425. Underneath power supply conductor 523 is an area 425 shown in reverse crosshatch corresponding to diode 423. Within I/O cell 420 and underneath power supply conductor 524 is both an area 425 shown in reverse crosshatch corresponding to diode 422 and a second unshaded area corresponding to diode 424.

I/O cell 440 includes a bonding pad, not shown in FIG. 5, for forming an interconnection point for the corresponding I/O signal and four identified areas relevant to understanding the layout. Within I/O cell 420 and underneath power supply conductor 521 is both an area shown in reverse crosshatch corresponding to diode 442 and a second unshaded area corresponding to diode 444. Underneath power supply rail 522 is an area shown in reverse crosshatch corresponding to diode 443. Underneath power supply conductor 523 and 524 is an area shown in crosshatch corresponding to clamping transistor 445.

Within power cell 460 and underneath power supply conductors 511-514 is both an unshaded area corresponding to diode 466 and an unshaded area corresponding to transistor 464. Underneath power supply conductors 516-518 is both an unshaded area corresponding to diode 465 and an unshaded area corresponding to transistor 462. In the area between power supply rail 518 and signal rail 519 is an unshaded area corresponding to boost and trigger circuit 461. Underneath power supply conductors 522 and 523 is both a first area corresponding to diode 467 and a second area corresponding to diode 468. Underneath power supply conductor 524 is an unshaded area corresponding to boost and trigger circuit 463.

I/O cell 420 and I/O cell 440 includes additional areas, not shown in FIG. 5, containing the other circuit elements from FIG. 4. Notably, I/O cells include or are associated with I/O pads that are formed in a top layer of metallization. These I/O cells are unpassivated areas suitable for connection to wire bonds, solder bumps for flip-chip die attach packaging, or the like. The bonding pads may be staggered between adjacent I/O cells, and I/O cells 420 and 440 need not be located on an edge of the integrated circuit but may instead be located in an interior portion.

The actual layout of the I/O pads of FIG. 4 allows integrated circuit area to be reduced by combining a bonding pad (and corresponding output driver circuitry) for one power domain with at least one ESD protection element for another power domain. Thus the circuit area underneath power supply conductors of one power domain can be dedicated to protection for that power domain whereas the I/O circuitry can be dedicated for use in the other power domain.

Moreover each I/O cell has protection elements for protecting both power domains instead of just for the power domain that the I/O circuitry is operating in. Thus protection elements can be distributed more uniformly along the power supply buses and the I/O cells for both power domains interspersed with each other, while avoiding excessive IR drops along long discharge paths.

Note that some applications may require a common power supply conductor for the two power domains. So for example in an alternate embodiment separate positive power supply conductors could establish the first and second power domains with respect to a common VSS conductor. In that case diodes corresponding to diodes 467 and 468 would not be needed. Also the trigger circuits could be distributed differently within the I/O bank, such as being within power cells, being within the I/O cells, or existing outside such cells. Moreover certain features described above, such as the boost bus, could be omitted in other embodiments.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An integrated circuit comprising:
    a first power domain;
    a second power domain;
    a bank of input/output (I/O) cells coupled to said first and second power domains, including a first plurality of active clamps for said first power domain and a second plurality of active clamps for said second power domain wherein said first and second pluralities of active clamps overlap along said bank of I/O cells.

2. The integrated circuit of claim 1, wherein each of said first and second pluralities of active clamps operate in parallel to dissipate an ESD event occurring between positive power supply and ground rails of respective ones of said first and second power domains.

3. The integrated circuit of claim 2, wherein said bank of I/O cells further comprises:
    a first plurality of I/O cells each conducting a respective I/O signal referenced to said first power domain; and
    a second plurality of I/O cells each conducting a respective I/O signal referenced to said second power domain.

4. The integrated circuit of claim 3, wherein each of said first plurality of I/O cells comprises:
    a first diode coupled between a respective bonding pad and a respective positive power supply rail of said first power domain;
    a second diode coupled between a respective ground rail of said first power domain and said respective bonding pad; and
    an active clamp coupled between said respective positive power supply rail and said respective ground rail of said first power domain.

5. The integrated circuit of claim 4, wherein each of said second plurality of I/O cells comprises:
    a first diode coupled between a respective bonding pad and a respective positive power supply rail of said second power domain;
    a second diode coupled between a respective ground rail of said second power domain and said respective bonding pad; and
    an active clamp coupled between said respective positive power supply rail and said respective ground rail of said second power domain.

6. The integrated circuit of claim 3, wherein each of said first plurality of I/O cells comprises:
    a first diode coupled between a respective bonding pad and a respective positive power supply rail of said first power domain;
    a second diode coupled between a respective ground rail of said first power domain and said respective bonding pad; and
    an active clamp coupled between a respective positive power supply rail and a respective ground rail of said second power domain.

7. The integrated circuit of claim 6, wherein each of said second plurality of I/O cells comprises:
    a first diode coupled between a respective bonding pad and said respective positive power supply rail of said second power domain;
    a second diode coupled between said respective ground rail of said second power domain and said respective bonding pad; and
    an active clamp coupled between said respective positive power supply rail and said respective ground rail of said first power domain.

8. An integrated circuit comprising:
    a plurality of input/output (I/O) cells each having a bonding pad for conducting an I/O signal referenced to a respective first power domain and at least one ESD protection element for a respective second power domain; and
    a plurality of conductors for said first and second power domains crossing each of said plurality of I/O cells.

9. The integrated circuit of claim 8, wherein each of said plurality of I/O cells further comprises:
    at least one ESD protection element for said respective first power domain.

10. The integrated circuit of claim 8, wherein said plurality of I/O cells comprises:
    a first I/O cell for conducting an I/O signal referenced to a first power domain and at least one ESD protection element for a respective second power domain; and
    a second I/O cell for conducting an I/O signal referenced to said second power domain and at least one ESD protection element for said first power domain.

11. The integrated circuit of claim 8, wherein said at least one ESD protection element for said respective second power domain comprises an active clamp, and wherein the integrated circuit further comprises trigger circuitry for activating active clamps of said plurality of I/O cells in response to detecting ESD events.

12. The integrated circuit of claim 11, wherein said active clamp comprises a metal-oxide-semiconductor (MOS) transistor having a first source/drain terminal coupled to a positive power supply voltage rail of said respective second power domain, a gate coupled to said trigger circuitry for receiving a respective trigger signal, and a second source/drain terminal coupled to a negative power supply voltage rail of said respective second power domain.

13. An integrated circuit comprising:
    a plurality of input/output (I/O) cells each having a bonding pad for conducting a respective I/O signal and at least one ESD protection element for each of a first power domain and a second power domain; and a plurality of conductors for said first and second power domains crossing each of said plurality of I/O cells.

14. The integrated circuit of claim 13, wherein for a first one of said plurality of I/O cells:
   said respective output signal is referenced to said first power domain;
   said at least one ESD protection element for said first power domain comprises first and second diodes; and
   said at least one ESD protection element for said second power domain comprises an active clamp.

15. The integrated circuit of claim 14, wherein for a second one of said plurality of I/O cells:
   said respective output signal is referenced to said second power domain;
   said at least one ESD protection element for said first power domain comprises an active clamp;
   said at least one ESD protection element for said second power domain comprises first and second diodes.

16. The integrated circuit of claim 15, wherein said active clamp for each of said first one of said plurality of I/O cells and said second one of said plurality of I/O cells comprises an N-channel metal-oxide-semiconductor (MOS) transistor.

17. The integrated circuit of claim 13, further comprising:
   horizontally extending power supply buses for each of said first and second power domains,
   wherein each of said plurality of I/O cells is located adjacent to said horizontally extending power supply buses.

18. The integrated circuit of claim 17, further comprising:
   a power cell located adjacent to said horizontally extending power supply buses, said power cell comprising trigger circuitry for activating an active clamp of each of said first and second I/O cells in response to ESD events.

19. The integrated circuit of claim 18, wherein said trigger circuitry comprises:
   a first trigger circuit having inputs coupled between positive and negative power supply voltage rails of the first power domain, and an output for providing a first trigger signal to activate said active clamp of said second power domain in response to sensing an ESD event in the first power domain; and
   a second trigger circuit having inputs coupled between positive and negative power supply voltage rails of the second power domain, and an output for providing a second trigger signal to activate said active clamp of said second power domain in response to sensing an ESD event in the second power domain.

20. The integrated circuit of claim 19, further comprising:
   a first diode having a positive terminal coupled to a bonding pad of said first I/O cell, and a negative terminal coupled to a first boost rail, and
   a second diode having a positive terminal coupled to a bonding pad of said second I/O cell, and a negative terminal coupled to a second boost rail,
   wherein said first trigger circuit further has an input coupled to said first boost rail and provides said first trigger signal using a voltage on said first boost rail, and
   wherein said second trigger circuit further has an input coupled to said first boost rail and provides said second trigger signal further in response to sensing an ESD event on said second boost rail.

* * * * *